United States Patent

Comino et al.

Patent Number: 6,075,820
Date of Patent: Jun. 13, 2000

[54] SAMPLING RECEIVER WITH MULTI-BRANCH SIGMA-DELTA MODULATORS AND DIGITAL CHANNEL MISMATCH CORRECTION

[75] Inventors: Vittorio Comino, Keansburg, N.J.; Allen Chung-Li Lu, Stanford, Calif.

[73] Assignee: Lucent Technologies Inc., Murray Hill, N.J.

[21] Appl. No.: 08/864,046

[22] Filed: May 28, 1997

[51] Int. Cl.$^7$ .................................................. H04B 14/06
[52] U.S. Cl. ........................... 375/245; 341/143; 375/316
[58] Field of Search .................................... 375/247, 316; 341/143, 110, 122, 126

[56] References Cited

U.S. PATENT DOCUMENTS

| | | | |
|---|---|---|---|
| 4,772,871 | 9/1988 | Suzuki et al. | 341/155 |
| 4,951,052 | 8/1990 | Jacob et al. | 341/122 |
| 5,073,777 | 12/1991 | Fukuhara et al. | 341/131 |
| 5,075,679 | 12/1991 | Gazsi | 341/143 |
| 5,196,852 | 3/1993 | Galton | 341/143 |
| 5,341,136 | 8/1994 | Przybysz et al. | |
| 5,363,101 | 11/1994 | Ueki | 341/143 |
| 5,400,368 | 3/1995 | Cheng et al. | |
| 5,414,424 | 5/1995 | Cabler | 341/143 |
| 5,568,142 | 10/1996 | Velazquez | 341/126 |
| 5,627,536 | 5/1997 | Ramirez | 341/141 |
| 5,841,388 | 11/1998 | Yasuda et al. | 341/155 |

OTHER PUBLICATIONS

A.K. Ong and B.A. Wooley, "A Two–Path Bandpass ΣΔ Modulator for Digital IF Extraction at 20 MHz," 1997 IEEE International Solid–State Circuits Conference, ISSCC '97, Paper FP 13.3, 1997.

P.P Vaidyanathan, "Multirate Digital Filters, Filter Banks, Polyphase Networks and Applications: A Tutorial," Proceedings of the IEEE, vol. 78, No. 1, pp. 56–93, Jan. 1990.

M. Motamed et al., "The Double Loop Sigma Delta Modulator with Unstable Filter Dynamics: Stability Analysis and Tone Behavior," IEEE Trans. on Circuits and Systems II, vol. 43, No. 8, pp. 549–559, Aug. 1996.

B.P. Brandt et al., "Second–Order Sigma–Delta Modulation for Digital–Audio Signal Acquisition," IEEE J. of Solid State Circuits, vol. 26, pp. 618–625, 1991.

J.C. Candy, "A Use of Double Integration in Sigma Delta Modulation," IEEE Trans. on Communications, vol. COM–33, No. 3, pp. 249–257, Mar. 1985.

F.W. Singor et al., "Switched–Capacitor Bandpass Delta–Sigma A/D Modulation at 10.7 MHz," IEEE J. of Solid State Circuits, vol. 30, No. 3, pp. 184–192, Mar. 1995.

(List continued on next page.)

*Primary Examiner*—Stephen Chin
*Assistant Examiner*—Mohammad Ghayour

[57] ABSTRACT

An IF sampling receiver for use in a wireless communication system includes first and second channels, with one channel generating an in-phase (I) component of an incoming analog IF signal, and the other channel generating a quadrature (Q) component of the analog IF signal. Each of the two channels of the IF sampling receiver includes a corresponding sigma-delta modulator channel. Each of the two sigma-delta modulator channels may be separated into m parallel branches by applying a polyphase decomposition technique to one or more resonators associated with the sigma-delta modulator. The invention thus provides a general framework for configuring a given channel of a sigma-delta modulator to include m parallel branches. The invention also provides a technique for separating a given sigma-delta modulator into n parallel channels, where n is greater than 2. Each of the n parallel channels may then be separated into m parallel branches. Mismatch between the first and second channels of the IF sampling receiver may be corrected by using a ratio of first and second channel power levels, as measured during a calibration mode, to multiply one of the I or Q components during normal operation, such that the I and Q components are brought back into balance to a first order approximation.

23 Claims, 4 Drawing Sheets

OTHER PUBLICATIONS

N. Tan et al., "Fourth–Order Two–Stage Sigma–Delta Modulator Using Both 1 Bit and Multibit Quantisers," Electronics Letters, vol. 29, No. 11, pp. 937–938, May 1993.

B.E. Boser et al., "The Design of Sigma–Delta Modulation Analog–to–Digital Converters," IEEE J. of Solid State Circuits, vol. 23, No. 6, pp. 1298–1307, Dec. 1988.

C. Samori et al., "Two–Path Structures for High Performance Sigma–Delta Modulators," Electronics Letters, vol. 31, No. 19, pp. 1624–1625, Sep. 1995.

J.M. de la Rosa et al., "CMOS Fully–Differential Bandpass Sigma–Delta Modulator Using Switched–Current Circuits," Electronics Letters, vol. 32, No. 3, pp. 156–157, Feb. 1996.

N. Tan, "Fourth–Order SI Sigma–Delta Modulators For High Frequency Applications," Electronics Letters, vol. 31, No. 5, pp. 333–334, Mar. 1995.

T. Okamoto et al., "A Stable High–Order Delta–Sigma Modulator with an FIR Spectrum Distributor," IEEE J. of Solid State Circuits, vol. 28, No. 7, pp. 730–734, Jul. 1993.

P. Benabes et al., "New High–Order Universal Sigma–Delta Modulator," Electronics Letters, vol. 31, No. 1, Jan. 1995.

H. Qiuting et al., "Use of Oversampled Sigma–Delta Modulator for Analogue Adaptive FIR Letters Based on LMS Algorithm," Electronics Letters, vol. 28, No. 8, pp. 751–753, Apr. 1992.

N. Tan et al., "Second–Order Delta–Sigma Modulator with Two 1 Bit Quantisers," Electronics Letters, vol. 28, No. 16, pp. 1486–1488, Jul. 1992.

M.I. Mathew et al., "Noise Performance Comparison for Third and Fourth Order Sigma–Delta Modulators Having Parameter Tolerance Errors," Electronics Letters, vol. 26, No. 3, pp. 158–159, Feb. 1990.

P. Benabes et al., "New Wideband Sigma–Delta Convertor," Electronics Letters, vol. 29, No. 17, pp. 1575–1577, Aug. 1993.

Z.X. Zhang et al., "N–Path Bandpass Sigma–Delta Analog–to–Digital Convertor," Electronics Letters, vol. 27, No. 22, pp. 2008–2009, Oct. 1991.

V. Friedman et al., "A Dual–Channel Voice–Band PCM Codec Using Sigma–Delta Modulation Technique," IEEE J. of Solid State Circuits, Vol. 24, No. 2, pp. 274–279, 1989.

G. Yin et al., "A High–Frequency and High–Resolution Fourth–Order Sigma–Delta A/D Converter in BiCMOS Technology," IEEE J. of Solid State Circuits, vol. 29, No. 8, PP. 857–865, Aug. 1994.

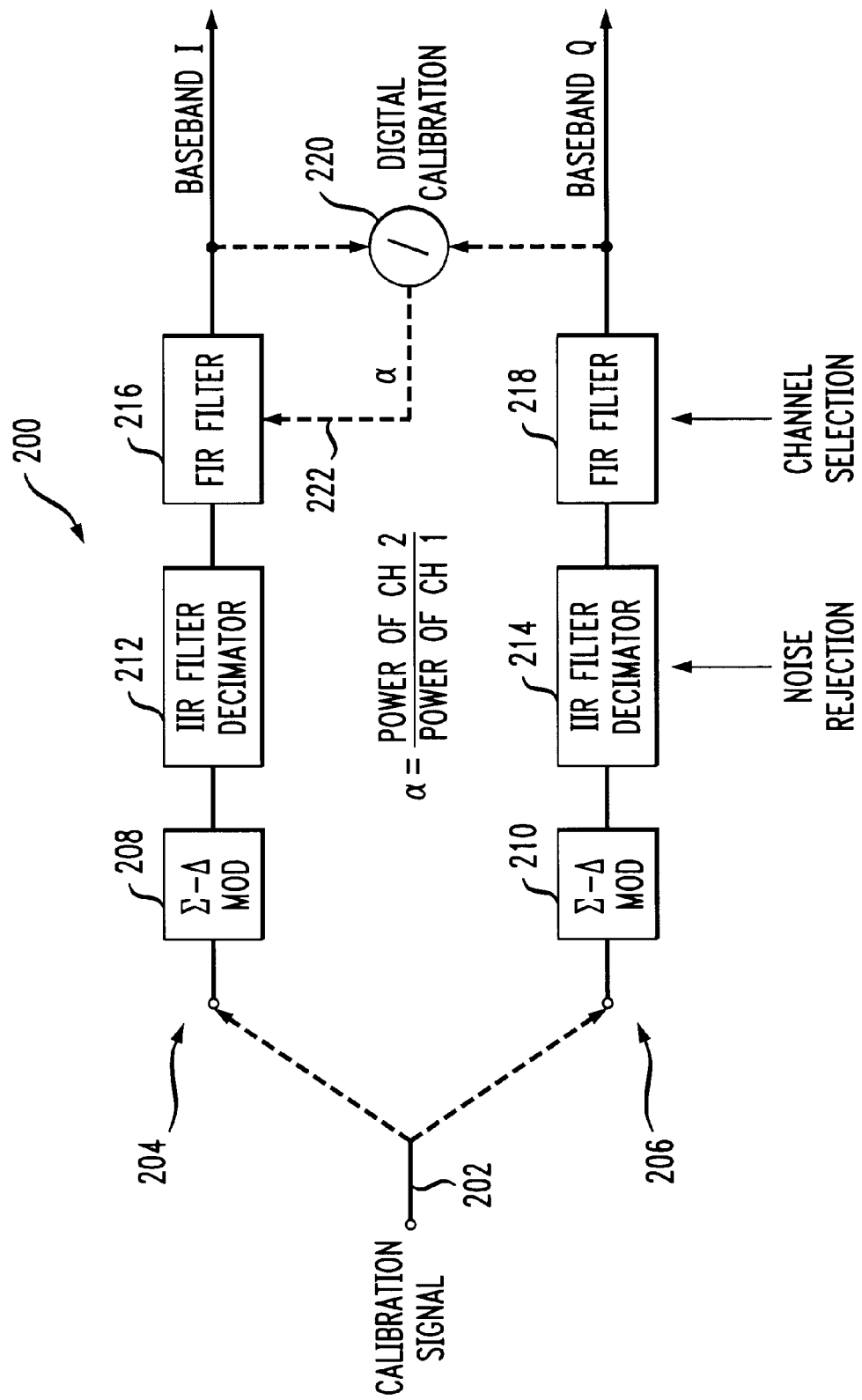

SAMPLING RECEIVER WITH MULTI-BRANCH SIGMA-DELTA MODULATORS AND DIGITAL CHANNEL MISMATCH CORRECTION

FIELD OF THE INVENTION

The present invention relates generally to wireless communication systems and more particularly to intermediate frequency (IF) sampling receivers or other types of sampling receivers for use in wireless communication systems.

BACKGROUND OF THE INVENTION

Demand for wireless communication devices, such as portable telephones for use in cellular and Personal Communications Service (PCS) systems, is continually increasing. In a typical portable telephone or other wireless receiver, an input analog signal is received and eventually converted to the digital domain for further processing. In order to reduce the amount of required analog circuitry and thereby provide a higher level of circuit integration in the receiver, it is generally desirable to provide the conversion to the digital domain as close as possible to the analog signal input. A conventional technique involves down-converting an input radio frequency (RF) analog signal to an intermediate frequency (IF) analog signal by mixing it with a local oscillator (LO), and then converting the analog IF signal to the digital domain using sigma-delta modulators. However, this approach often requires that the IF signal frequency be very high, such that RF bandpass filter requirements can be relaxed and the need for a second set of IF demodulation circuitry can be avoided. This places a heavy demand on the analog circuitry, and may prevent desired performance measures from being achieved in important applications.

FIG. 1 shows a conventional second-order single-channel bandpass sigma-delta modulator 10. The modulator 10 receives an IF signal on input 12 from an RF downconverter, which is not shown. The IF signal is sampled using a switch 14 which operates at a rate of $f_{sp}$ of exactly four times the IF signal frequency. The sampled IF signal is applied to a first subtractor 16, a first resonator 18, a second subtractor 20 and a second resonator 22. The output of the second resonator 22 is applied to a comparator 24, the output of which drives first and second multipliers 26 and 28. The output of the comparator 24 is also applied to a 1-bit digital-to-analog (D/A) converter 30. The output of the converter 30 drives inputs of the first and second subtractors 16, 20. The output of the comparator 24 is a stream of bits representative of the incoming analog signal. The in-phase (I) and quadrature (Q) components of the analog signal are extracted by multiplying the bit stream at the output of the comparator 24 by the bit sequences (1 0-1 0 . . . ) and (0 1 0-1 1 . . . ) in multipliers 26 and 28, respectively. The conventional sigma-delta modulator 10 is limited by the maximum sampling rate $f_{sp}$ to operation at only relatively low IF signal frequencies.

One approach to reducing the maximum sampling rate and thereby increasing the IF operating frequency involves separating a given sigma-delta modulator into two parallel channels, one channel for processing the even samples, and the other channel for processing the odd samples. This approach allows the maximum sampling rate to be decreased by a factor of two. Exemplary two-channel sigma-delta modulators for use in IF sampling receivers are described in A. K. Ong and B. A. Wooley,"A Two-Path Bandpass ΣΔ Modulator for Digital IF Extraction at 20 MHz," 1997 IEEE International Solid-State Circuits Conference, ISSCC '97, Paper FP 13.3, 1997, which is incorporated by reference herein. The technique described in this reference provides some improvement in the maximum IF operating frequency of a sigma-delta modulator in an IF sampling receiver by utilizing two parallel channels, thereby reducing by a factor of one-half the maximum sampling rate at which any particular channel needs to operate. However, this reference does not provide a general approach which permits a given channel of a single-channel or two-channel sigma-delta modulator to be separated into multiple parallel channels. Moreover, the resulting sigma-delta modulators generally include no more than two parallel channels. In addition, these and other conventional approaches fail to provide any techniques for correcting mismatches between multiple channels of a given sigma-delta modulator, and thus do not provide sufficiently accurate performance in many important applications.

It is therefore apparent that a need exists for an improved technique for implementing sigma-delta modulators in a sampling receiver, such that any desired number of parallel branches can be provided for a given channel, and mismatch between different channels can be corrected in an efficient manner.

SUMMARY OF THE INVENTION

An IF sampling receiver in accordance with the invention includes at least one sigma-delta modulator channel which is configured to include m parallel branches. Each of the parallel branches of a given sigma-delta modulator channel may thus operate at 1/m of the sampling rate of the overall modulator, such that the maximum required sampling rate of the modulator is reduced by a factor of m. The invention also provides techniques for separating a given sigma-delta modulator into n parallel channels, where n is greater than two. Conventional sigma-delta modulators generally include no more than two parallel channels, and generally do not further separate channels into multiple parallel branches. A typical implementation of the IF sampling receiver includes first and second channels, one generating an in-phase (I) component of an incoming analog IF signal, and the other generating a quadrature (Q) component of the analog IF signal. Each of the two channels of the IF sampling receiver includes a corresponding channel of a two-channel sigma-delta modulator, or a corresponding single-channel sigma-delta modulator. In either case, one or both of the two sigma-delta modulator channels may be separated into m parallel branches by applying a polyphase decomposition technique to one or more resonators associated with the sigma-delta modulator channel. The invention thus provides a general framework for configuring a given channel of a sigma-delta modulator with m parallel branches.

In accordance with another aspect of the invention, the mismatch between first and second channels of an IF sampling receiver may be corrected using a technique which can be implemented in inexpensive digital circuitry. An exemplary embodiment of an IF sampling receiver with mismatch correction includes first and second channels for generating respective I and Q components of an incoming analog IF signal. Each of the channels includes a corresponding channel of a multiple-channel sigma-delta modulator, an infinite impulse response (IIR) filter and decimator for noise rejection, and a finite impulse response filter (FIR) for channel selection. During a calibration operation, a calibration signal is simultaneously applied to the inputs of both the first and second channels. The calibration signal may be a direct-current (DC) signal, a sinusoidal signal at the IF carrier signal frequency, or another suitable signal. The calibration signal outputs of the first and second channels during the calibration operation are applied to a divider circuit which generates a ratio of the output power levels of the first and second channels. This ratio is then used during normal circuit operation to correct for mismatch between the channels. For example, a ratio of the second channel output power to the first channel output power may be used to multiply the first channel signal in the first channel FIR filter, such that the corresponding detected I and Q components are brought back into balance to a first order approximation. Alternatively, a ratio of the first channel output power to the second channel output power during calibration may be used to multiply the second channel signal in the second channel FIR filter during normal circuit operation. Other alternative configurations in which a ratio of first and second channel power is used to correct channel mismatch are also possible.

The use of multiple parallel branches in a sigma-delta modulator channel allows the sigma-delta modulator and the corresponding sampling receiver to operate at a lower sampling rate for a given IF signal frequency, or at a higher IF signal frequency for a given sampling rate. The sigma-delta modulators of the present invention can thus be effectively utilized in a wider variety of applications than has heretofore been possible using conventional techniques. Moreover, the digital mismatch correction of the present invention provides an increased signal-to-noise ratio (SNR) and other performance improvements for a sampling receiver incorporating a multiple-channel sigma-delta modulator. These and other features and advantages of the present invention will become more apparent from the accompanying drawings and the following detailed description.

BRIEF DESCRIPTION OF THE DRAWINGS

FIG. 5 is a block diagram of an exemplary two-channel IF sampling receiver with channel mismatch correction in accordance with the invention.

DETAILED DESCRIPTION OF THE INVENTION

The present invention will be illustrated below in conjunction with exemplary sigma-delta modulators and IF sampling receivers for use in a wireless communication system. It should be understood, however, that the invention is not limited to use with any particular type of sigma-delta modulator, receiver or communication system, but is instead more generally applicable to any modulator, receiver or system in which it is desirable to increase the operating frequency of the modulator without unduly increasing the required sampling rate. For example, although the invention is well-suited for use in IF sampling receivers in a cellular or personal communication services (PCS) system configured in accordance with standards such as TDMA, GSM, TIA/EIA/IS-95A, "Mobile Station—Base Station Compatibility Standard for Dual-Mode Wideband Spread Spectrum Cellular System," June 1996, and ANSI J-STD-008, "Personal Station—Base Station Compatibility Requirements for 1.8 to 2.0 GHz Code Division Multiple Access (CDMA) Personal Communication Systems," the invention may also be utilized in receivers of other types of cellular or PCS systems. The invention is not limited to use with IF signal frequencies, and could be applied to the sampling of RF signal frequencies as well as other signal frequencies. The term "intermediate frequency" or "IF" as used herein refers generally to a frequency which corresponds to a down-converted version of a primary RF carrier frequency in a communication system. The term "sigma-delta modulator" refers generally to any type of circuit which utilizes sum and difference operations to convert an analog signal to a digital bit stream. The term "channel" in the context of a sigma-delta modulator refers to a distinct signal path through the modulator. Each channel of a multi-channel sigma-delta modulator may be arranged to include multiple subsampled "branches" in accordance with the present invention. Each branch implements a portion of a resonator or other function associated with a particular sigma-delta modulator.

Figure 1:
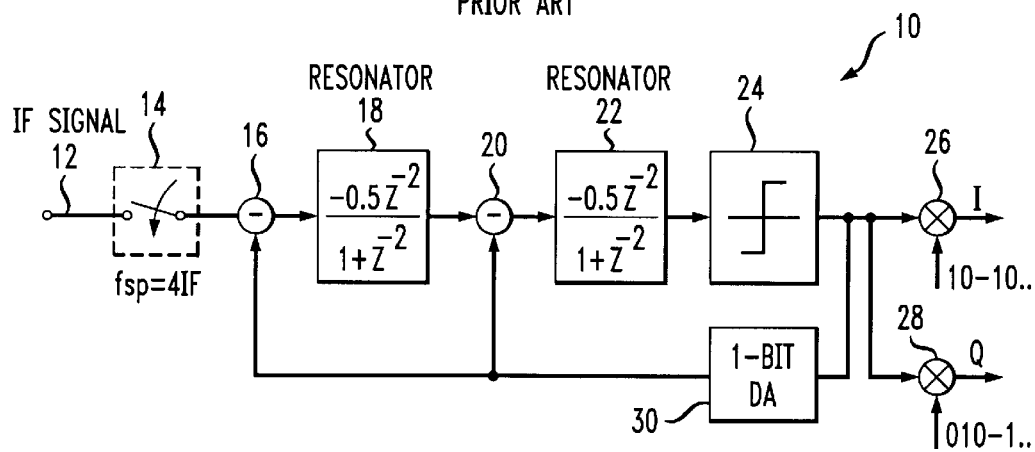
FIG. 1 shows a conventional single-channel sigma-delta modulator suitable for use in an IF sampling receiver in a wireless communication system.
Figure 2:
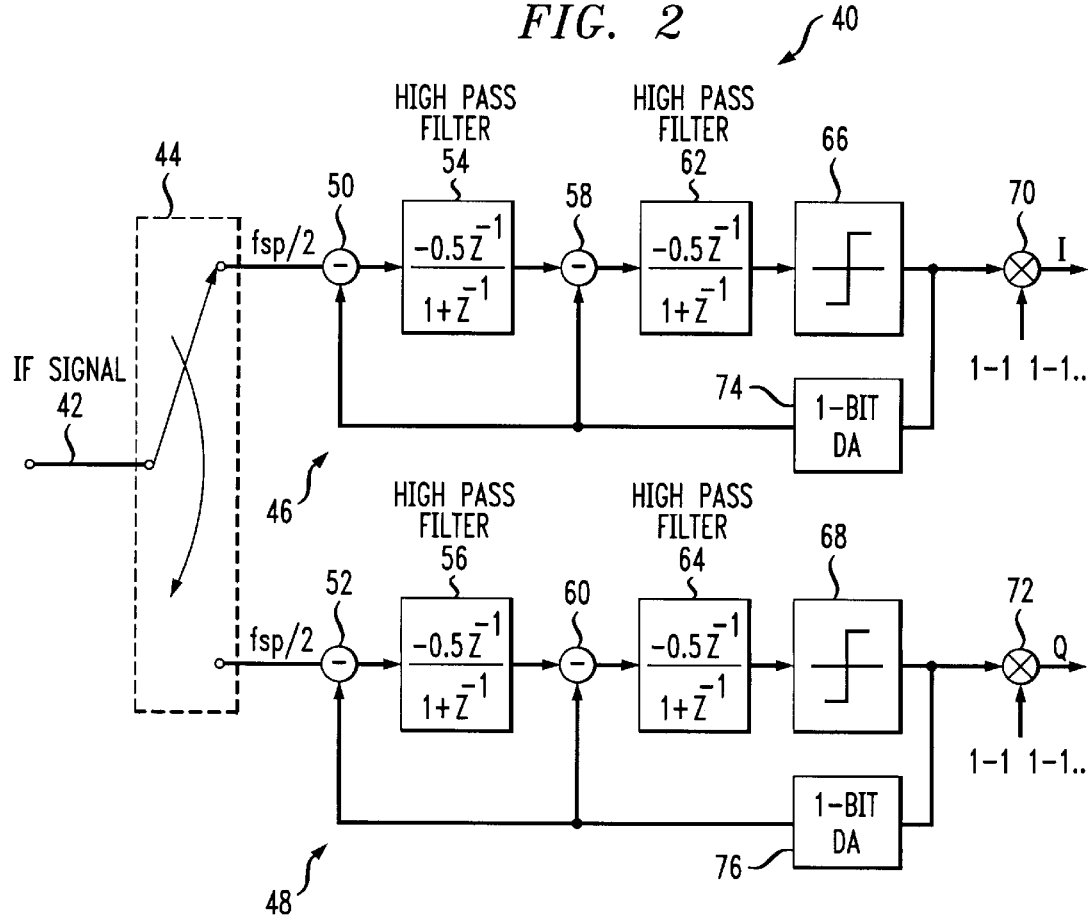
FIG. 2 shows an exemplary two-channel sigma-delta modulator in which each of the channels may be separated into m parallel branches to reduce the maximum required sampling rate in accordance with the invention.

FIG. 2 shows an exemplary sigma-delta modulator 40 with two parallel channels, each of which may be further separated into parallel branches in accordance with the present invention. The separation of the sigma-delta modulator 40 into two parallel channels is based in part on the fact that the even samples of the input analog IF signal in the conventional modulator 10 of FIG. 1 are processed independently of the odd samples of the analog IF signal. This allows a conventional single-channel modulator structure such as that of FIG. 1 to be separated into two identical channels as shown in FIG. 2. The two-channel sigma-delta modulator 40 receives an analog IF signal on an input 42, and the IF signal is sampled using a switch 44. The sigma-delta modulator 40 includes a first channel 46 and a second channel 48. The switch 44 operates at a sampling rate of $f_{sp}$, such that each of the two channels 46, 48 is connected to the input 42 at a rate of $f_{sp}/2$. As will be described in greater detail below, the sampling rate $f_{sp}$ in a two-channel sigma-delta modulator such as modulator 40 may be either 4 times the IF signal frequency or 4/3 times the IF signal frequency.

The even samples of the analog IF signal in sigma-delta modulator 40 are applied to the first channel 46, while the odd samples of the analog IF signal are applied to the second channel 48. Each of the channels 46,48 in this exemplary embodiment includes a number of first-order high-pass filter networks. The first and second channels 46, 48 include first subtractors 50,52, first high-pass filters 54, 56, second subtractors 58, 60, second high-pass filters 62, 64, comparators 66, 68, multipliers 70, 72 and 1-bit digital-to-analog converters 74, 76, respectively. The outputs of the comparators 66, 68 are streams of bits representative of the incoming analog IF signal. The in-phase (I) and quadrature (Q) components of the analog IF signal are extracted by multiplying the bit streams at the outputs of the comparators 66, 68, respectively, by the bit sequence (1-1 1-1 . . . ) in multipliers 70 and 72, respectively. Each of the channels 46, 48 of the sigma-delta modulator 40 is thus used to convert one of the I and the Q components of the incoming IF signal from an analog to a digital format. The maximum sampling rate of the sigma-delta modulator 40 is reduced by a factor of two relative to that of the conventional single-channel sigma-delta modulator 10 of FIG. 1. The sigma-delta modulator 40 may be implemented using well-known switched-capacitor techniques.

Further reductions in the maximum required sampling rate may be achieved in accordance with the present invention by separating a sigma-delta modulator into more than two parallel channels. In general, a lowpass to bandpass transformation that generates a sigma-delta resonator of the form:

$$\frac{1}{1+z^{-n}}$$

can be configured to have n parallel channels. If the modulator 40 is separated into n parallel channels in this manner, the relationship between the sampling rate $f_c$ of each channel and the IF signal frequency $f_{IF}$ is then given by:

$$f_c = \frac{2 \cdot f_{IF}}{2k+1}$$

where k=0, 1, 2, . . . n−1. The different values of k specify the possible channel sampling rates for a given n-channel sigma-delta modulator. Values of k which are greater than 0 indicate the presence of subsampling. For example, in the two-channel sigma-delta modulator 40 of FIG. 2, the value of n is 2, and k may therefore take on the value of 0 or 1. The possible channel sampling rates are then either 4 times the IF signal frequency $f_{IF}$, for a value of k=0 and no subsampling, or 4/3 times $f_{IF}$ for a value of k=1 and subsampling, as was noted previously in conjunction with the description of FIG. 2. One aspect of the present invention thus relates to the separation of a given sigma-delta modulator into n parallel channels, where n is greater than two. As previously noted, conventional multi-channel sigma-delta modulators generally include no more than two channels, and thus fail to provide a general technique for configuring a sigma-delta modulator to include more than two parallel channels. As will be described in detail below, another aspect of the present invention relates to the separation of a given channel of a single-channel, two-channel or n-channel sigma-delta modulator into m parallel branches, in order to provide further reductions in the required sampling rate.

Figure 3:
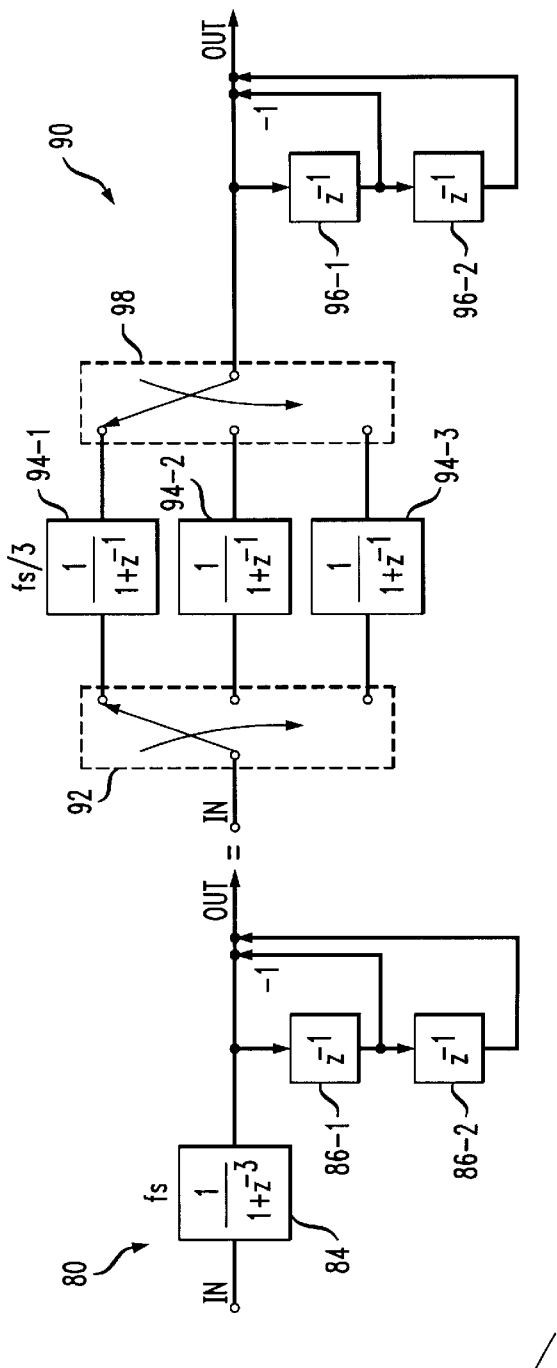
FIG. 3 illustrates a general technique for configuring a sigma-delta modulator to include m parallel branches in accordance with the invention.

FIG. 3 illustrates a general technique for separating a given channel of a single-channel or multiple-channel sigma-delta modulator into in parallel branches, where m may be greater than or equal to two. In the example of FIG. 3, the general technique is applied to implement a sigma-delta modulator channel having three parallel branches. An exemplary lowpass to bandpass transformation of the form given above is first expanded as follows:

$$\frac{1}{1+z^{-1}} = 1 - z^{-1} + z^{-2} - z^{-3} + z^{-4} - z^{-5} + z^{-6} - z^{-7} \ldots$$

The terms are then rearranged as indicated generally by the arrows in FIG. 3 and factored to yield:

$$1-z^{-3}+z^{-6}-z^{-9} \ldots + z^{-1}(1-z^{-3}+z^{-6}-z^{-9}) \ldots + z^{-2}(1-z^{-3}+z^{-6}-z^{-9} \ldots ) \ldots$$

which may be further rewritten as follows:

$$\frac{1}{1+z^{-3}} + \frac{z^{-1}}{1+z^{-3}} + \frac{z^{-2}}{1+z^{-3}} + \ldots = \frac{1}{1+z^{-3}}(1-z^{-1}+z^{-2}\ldots)$$

to provide an equivalent resonator. The above general technique utilizes a type of polyphase decomposition to generate a resonator which can be implemented using multiple parallel branches and can thus provide a sigma-delta modulator having a lower overall sampling rate. Polyphase decomposition is described generally in, for example, P. P. Vaidyanathan,"Multirate Digital Filters, Filter Banks, Polyphase Networks and Applications: A Tutorial," Proceedings of the IEEE, Vol. 78, No. 1, pp. 56–93, January 1990, which is incorporated by reference herein. It is believed that polyphase decomposition, although well-known per se, has not heretofore been applied to the problem of reducing the required sampling rate in a sampling receiver based on sigma-delta modulators.

FIG. 3 also shows a circuit 80 configured to implement the above-described equivalent resonator. The circuit 80 includes an element 84 of the form:

$$\frac{1}{1+z^{-3}}$$

as well as first and second $z^{-1}$ delay elements 86-1 and 86-2 arranged as shown. It should be noted that the line connecting the output of delay element 86-1 to the output of circuit 80 has a −1 multiplier adjacent to it, indicating that the output of delay element 86-1 is multiplied by −1 before being combined with the other signals at the output of circuit 80. The elements 84, 86-1 and 86-2 together provide the resonator function shown above. FIG. 3 further shows a circuit 90 which is equivalent to the circuit 80, but in a form suitable for reducing the maximum required sampling rate in a sigma-delta modulator of a sampling receiver. In the circuit 90, the element 84 is replaced with three elements 94-1, 94-2 and 94-3, each of the form:

$$\frac{1}{1+z^{-1}}$$

The circuit 90 also includes an input switch 92, an output switch 98, and delay elements 96-1 and 96-2. The input and output switches are connected to sample each of the elements 94-1, 94-2 and 94-3 at a sampling rate of $f_{sp}/3$, where $f_{sp}$ is the overall sampling rate used in the corresponding sigma-delta modulator. The delay elements 96-1 and 96-2 are configured to operate in the same manner as the delay elements 86-1 and 86-2 of circuit 80. A similar approach may be utilized to construct a resonator having more than three elements for use in an sigma-delta modulator channel having more than three parallel branches.

Figure 4:
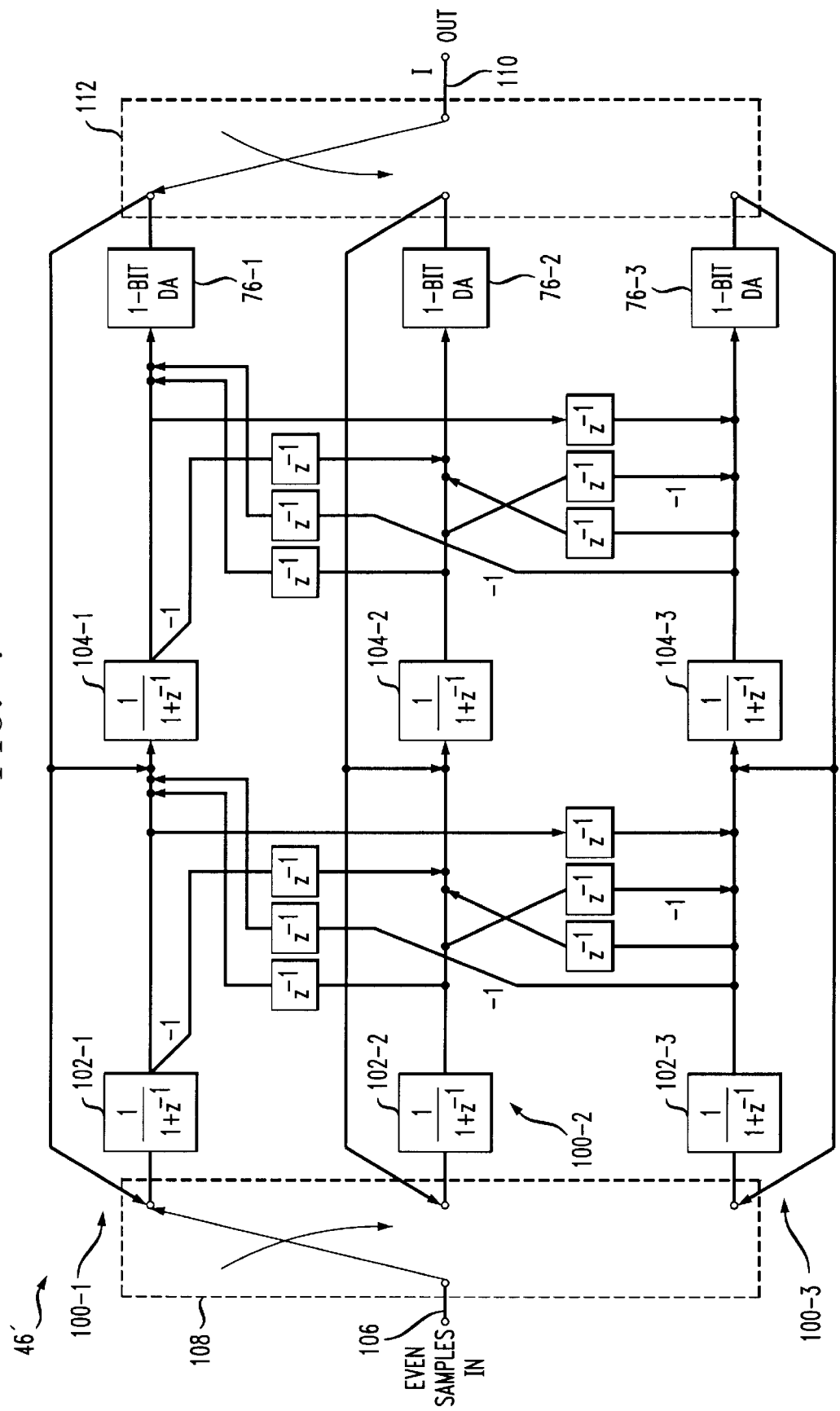
FIG. 4 illustrates application of the general technique of FIG. 3 to provide three parallel branches for a channel of the two-channel sigma-delta modulator of FIG. 2.

FIG. 4 shows a sigma-delta modulator channel 46' which corresponds to the channel 46 of FIG. 2 expanded to include three parallel branches using the general technique described in conjunction with FIG. 3. The sigma-delta modulator channel 46' includes first, second and third branches 100-1, 100-2 and 100-3, respectively. Each branch 100-i includes corresponding resonators 102-i and 104-i, a 1-bit D/A converter 76-i, and a number of delay elements labeled $z^{-1}$ and arranged as shown. Even samples of an input analog IF signal are applied to an input 106 of the channel 46'. An input switch 108 connects the input 106 sequentially to the inputs of the parallel branches 100-1, 100-2 and 100-3. Similarly, an output 110 of the channel 46' is connected sequentially via a switch 112 to each of the branch outputs. The sigma-delta modulator channel 46' of FIG. 4 performs operations equivalent to those of the channel 46 of FIG. 2, but the hardware of the channel 46' operates at a rate which is ⅓ that of the channel 46. The separation of a given sigma-delta modulator channel into m parallel branches in accordance with the present invention thus allows the sampling rate of the channel to be decreased, or allows the IF signal frequency to be increased, and thereby provides advantages over conventional techniques.

FIG. 5 shows an exemplary IF sampling receiver 200 with two parallel channels 204, 206 and channel mismatch correction in accordance with the present invention. Mismatch between the two parallel channels 204, 206 may degrade the signal-to-noise ratio (SNR) performance of the receiver 200, particularly in applications such as RF and audio signal reception in cellular, PCS and other wireless communication systems. This degradation is attributable to variation between the channels of the sigma-delta modulators used in the receiver. The variations include mismatch between the resonators 54, 56 and 62, 64. For example, resonators having denominators of the form $1+z^{-1}$ are in practice often of the form $1+az^{-1}$, where a may be 0.8 in a resonator of one channel but 0.9 in the corresponding resonator of the other channel, thereby creating a mismatch. The value of a generally depends on the particular technique used to implement the resonator. Other variations contributing to channel mismatch include gain variations in the comparators 66, 68, feedback path variations, and variations arising from imprecision in the design of the D/A converters 74, 76.

In a normal operating mode of the IF sampling receiver 200 of FIG. 5, an analog IF signal is applied to an input 202, and switched between the two parallel channels 204 and 206. The channels 204, 206 include corresponding sigma-delta modulator channels 208, 210. For example, the signal-delta modulator channel 208 in channel 204 may correspond to channel 46 of the sigma-delta modulator 40 of FIG. 2, while the sigma-delta modulator channel 210 in channel 206 may correspond to channel 48 of the sigma-delta modulator 40. The channels 204, 206 also include infinite impulse response (IIR) filter/decimators 212, 214, and finite impulse response (FIR) filters 216, 218, respectively. The IIR filter/decimators 212, 214 are used to provide noise rejection, while the FIR filters 216, 218 are used to select a particular channel of the incoming IF signal. The first channel 204 of the sampling receiver 200 generates the baseband I component of the incoming IF signal, while the second channel 206 generates the baseband Q component.

Correction of mismatch between the first and second channels 204, 206 is provided by generating in a divider 220 a ratio o of the first and second channel outputs. The ratio α in this example is generated during a calibration mode of operation during which a calibration signal is applied to the input 202 as shown in FIG. 5. The calibration signal may be a direct-current (DC) signal, a sinusoidal signal at the IF signal carrier frequency, or another suitable signal. This calibration signal is applied simultaneously to the first and second channels 204, 206, and the ratio α is generated by dividing the output of the second channel 206 by the output of the first channel 204. The ratio α is then supplied from the divider 220 via line 222 to an input of the FIR filter 216 of the first channel 204. During normal operation of the receiver 200, and after completion of the above-described calibration process, the baseband I component in channel 204 is multiplied by the ratio α in the FIR filter 216. This multiplication may be incorporated as part of the FIR filtering process carried out in FIR filter 216. The multiplication restores the balance between the first and second channels 204, 206 to a first order approximation. In an alternative embodiment of the receiver 200, the ratio α may be generated during calibration as the ratio of the first channel output power to the second channel output power, and the ratio used to multiply the baseband Q component in second channel 206. Other alternative techniques for adjusting the gain of one channel based on a ratio of power levels in both channels may also be used.

The above-described embodiments of the invention are intended to be illustrative only. Numerous alternative embodiments may be devised by those skilled in the art without departing from the scope of the following claims.

What is claimed is:

1. A method of processing a received signal in a communication system, the method comprising the steps of:

applying the received signal to at least one channel of a sigma-delta modulator in order to convert at least a portion of the received signal from an analog to a digital format; and sampling the received signal in a plurality of parallel branches of the at least one channel of the sigma-delta modulator, wherein each of at least a subset of the parallel branches operates at a sampling rate which is less than an effective sampling rate of the at least one channel of the sigma-delta modulator, and wherein the plurality of parallel branches are configured in accordance with a polyphase decomposition of at least one resonator function provided by the sigma-delta modulator.

2. The method of claim 1 wherein the sigma-delta modulator includes n parallel channels, where n is greater than two.

3. The method of claim 1 wherein the sampling step includes sampling in each of m parallel branches of the at least one channel at a sampling rate which is 1/m the effective sampling rate of the at least one channel of the sigma-delta modulator.

4. The method of claim 1 wherein the received signal is an analog IF signal including a baseband in-phase (I) and quadrature (Q) component, and the sampling step further includes sampling the received signal in m parallel branches for at least one of a first channel and a second channel corresponding to the respective I and Q components.

5. The method of claim 4 further including the step of correcting for mismatch between the first and second channels by multiplying a component associated with one of the channels by a ratio of power levels generated in the first and second channels during a calibration mode in which a calibration signal is applied to the first and second channels.

6. The method of claim 5 wherein the step of correcting for mismatch further includes the steps of:

computing a ratio of output power levels of the first and second channels during the calibration mode; and multiplying at least one of the I component and Q component by the ratio during a normal operating mode.

7. The method of claim 6 wherein the step of computing a ratio of output power levels of the first and second channels includes applying the outputs of the first and second channels to a divider circuit during the calibration mode.

8. The method of claim 6 wherein the step of multiplying at least one of the components by the ratio further includes the step of applying the ratio to a channel selection filter associated with the at least one component.

9. An apparatus for use in a processing a received signal in a sampling receiver, the apparatus comprising:

a sigma-delta modulator for converting at least a portion of the received signal from an analog to a digital format, the sigma-delta modulator having at least one channel which includes a plurality of parallel branches for sampling the received signal, wherein each of at least a subset of the plurality of parallel branches operates at a sampling rate which is less than an effective sampling rate of the at least one channel of the sigma-delta modulator, and wherein the plurality of parallel branches are configured in accordance with a polyphase decomposition of at least one resonator function provided by the sigma-delta modulator.

10. The apparatus of claim 9 wherein the plurality of parallel branches includes m parallel branches, and each of the m parallel branches is sampled at a sampling rate which is 1/m the effective sampling rate of the at least one channel of the sigma-delta modulator.

11. The apparatus of claim 9 wherein the sigma-delta modulator includes n parallel channels, where n is greater than 2.

12. An apparatus for processing a received signal in a sampling receiver, the apparatus comprising:

a first receiver channel including a first sigma-delta modulator channel; and a second receiver channel including a second sigma-delta modulator channel;

wherein the first and second sigma-delta modulator channels process samples of the received signal to convert at least a portion of the received signal from an analog to a digital format, and at least one of the sigma-delta modulator channels includes a plurality of parallel branches for sampling at least a portion of the received signal, and further wherein each of at least a subset of the plurality of parallel branches operates at a sampling rate which is less than an effective sampling rate of the at least one channel of the sigma-delta modulator, and the plurality of parallel branches are configured in accordance with a polyphase decomposition of at least one resonator function provided by the corresponding sigma-delta modulator channel.

13. The apparatus of claim 12 wherein both the first and the second sigma-delta modulator channels include a plurality of parallel branches for sampling portions of the received signal.

14. The apparatus of claim 12 wherein the plurality of parallel branches includes m parallel branches, and each of the m parallel branches are sampled at a sampling rate which is 1/m the effective sampling rate of the at least one channel of the at least one sigma-delta modulator.

15. The apparatus of claim 12 wherein the received signal is an analog IF signal including a baseband in-phase (I) and quadrature (Q) component, and the first receiver channel generates the baseband I component, while the second receiver channel generates the baseband Q component.

16. The apparatus of claim 12 further including a mismatch correction circuit for correcting mismatch between the first and second receiver channels by multiplying a component associated with one of the channels by a ratio of first and second channel power levels generated by applying a calibration signal to the first and second channels during a calibration mode of operation.

17. The apparatus of claim 16 wherein the mismatch correction circuit further includes:

a divider for computing a ratio of output power levels of the first and the second channels during the calibration mode; and a multiplier for multiplying at least one of the I component and the Q component by the ratio.

18. The apparatus of claim 17 wherein the multiplier is implemented as a component of a channel selection filter associated with the at least one component.

19. A method of processing a received signal in a communication system, the method comprising the steps of:

applying the received signal to a plurality of channels of a sigma-delta modulator in order to convert at least a portion of the received signal from an analog to a digital format;

sampling the received signal in a plurality of parallel branches of at least one of the channels of the sigma-delta modulator; and correcting for mismatch between at least a subset of the plurality of channels of the sigma-delta modulator by multiplying a component associated with a given one of the channels by a function of signal levels associated with the given channel and at least one other channel.

20. An apparatus for use in a processing a received signal in a sampling receiver, the apparatus comprising:

a sigma-delta modulator for converting at least a portion of the received signal from an analog to a digital format, the sigma-delta modulator having a plurality of channels, at least one of which includes a plurality of parallel branches for sampling the received signal, wherein the sigma-delta modulator further includes a circuit which is operative to correct for mismatch between at least a subset of the plurality of channels by multiplying a component associated with a given one of the channels by a function of signal levels associated with the given channel and at least one other channel.

21. An apparatus for processing a received signal in a sampling receiver, the apparatus comprising:

at least a first receiver channel including a first sigma-delta modulator channel and a second receiver channel including a second sigma-delta modulator channel;

wherein the first and second sigma-delta modulator channels process samples of the received signal to convert at least a portion of the received signal from an analog to a digital format, and at least one of the sigma-delta modulator channels includes a plurality of parallel branches for sampling at least a portion of the received signal; and a mismatch correction circuit for correcting mismatch between the first and second receiver channels by multiplying a component associated with a given one of the first and second channels by a function of signal levels associated with the first and second channels.

22. A method of processing a received signal in a communication system, the method comprising the steps of:

applying the received signal to at least first and second sigma-delta modulator channels in order to convert at least a portion of the received signal from an analog to a digital format;

sampling the received signal in a plurality of parallel branches of at least one of the first and second channels; and correcting for mismatch between the first and second channels by multiplying a component associated with one of the channels by a ratio of power levels generated in the first and second channels during a calibration mode in which a calibration signal is applied to the first and second channels.

23. An apparatus for processing a received signal in a sampling receiver, the apparatus comprising:

a first receiver channel including a first sigma-delta modulator channel; and a second receiver channel including a second sigma-delta modulator channel;

wherein the first and second sigma-delta modulator channels process samples of the received signal to convert at least a portion of the received signal from an analog to a digital format, and at least one of the sigma-delta modulator channels includes a plurality of parallel branches for sampling at least a portion of the received signal; and a mismatch correction circuit for correcting mismatch between the first and second receiver channels by multiplying a component associated with one of the channels by a ratio of first and second channel power levels generated by applying a calibration signal to the first and second channels during a calibration mode of operation.

* * * * *